(12) United States Patent
Togawa

(10) Patent No.: US 6,252,470 B1
(45) Date of Patent: Jun. 26, 2001

(54) MICROWAVE OSCILLATING CIRCUIT AND REMOTELY CONTROLLABLE "KOTATSU" USING THE SAME

(75) Inventor: Kazuaki Togawa, Kagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/451,318

(22) Filed: Nov. 30, 1999

(30) Foreign Application Priority Data

Aug. 19, 1998 (JP) .................................................. 10-233211

(51) Int. Cl.[7] .................................. H03B 5/18; H04B 1/04
(52) U.S. Cl. .................. 331/117 D; 331/77; 331/96; 331/108 D; 331/117 R; 331/179; 455/129
(58) Field of Search ................................. 331/74, 77, 96, 331/107 DP, 108 D, 117 R, 117 FE, 117 D, 179; 455/129; 333/235

(56) References Cited

U.S. PATENT DOCUMENTS

| | | | |
|---|---|---|---|
| 3,796,976 | * | 3/1974 | Heng et al. ......................... 333/84 M |
| 3,921,056 | * | 11/1975 | Mahoney ................................. 328/15 |
| 4,527,130 | * | 7/1985 | Lütteke ................................ 331/36 C |
| 4,600,906 | * | 7/1986 | Blight ................................... 333/205 |
| 4,818,956 | * | 4/1989 | Stajcer .................................... 331/96 |
| 4,906,956 | * | 3/1990 | Kakihana .............................. 333/246 |
| 5,321,374 | * | 6/1994 | Uwano ................................. 333/202 |
| 5,805,026 | * | 9/1998 | Kuroda et al. .......................... 331/96 |
| 5,982,244 | * | 11/1999 | Fujisaki .................................. 331/99 |
| 6,043,727 | * | 3/2000 | Warneke et al. ...................... 333/205 |

FOREIGN PATENT DOCUMENTS

| | | |
|---|---|---|
| 5-335833 | 12/1993 | (JP) . |
| 06013808 | 1/1994 | (JP) . |
| 09162642 | 6/1997 | (JP) . |

* cited by examiner

*Primary Examiner*—David Mis
(74) *Attorney, Agent, or Firm*—Ratner & Prestia

(57) ABSTRACT

An oscillating circuit adjusts its oscillating frequency through the following method. A tip-open type strip-line stub coupled to the base terminal of the transistor. An electrical length of the stub is changed by an adjusting mechanism such as coupling the stub with conductive small lands provided near the stub tip by a chip resistor. A "kotatsu" employs a remote controller including this oscillating circuit.

12 Claims, 6 Drawing Sheets

Frequency : Standard

Frequency : Low
⇩
Electrical length : Short

Frequency : Lower
⇩
Electrical length : Shorter

Frequency : High
⇩
Electrical length : Long

Frequency : Higher
⇩
Electrical length : Longer

MICROWAVE OSCILLATING CIRCUIT AND REMOTELY CONTROLLABLE "KOTATSU" USING THE SAME

FIELD OF THE INVENTION

The present invention relates to a microwave oscillating circuit used in a remote controller of home appliance products such as "kotatsu" adjustable by a remote controller using a radio wave.

BACKGROUND OF THE INVENTION

A remote controller attached to home appliances adjustable with a radio wave from a remote controller employs a microwave in order to avoid interference with unwanted electromagnetic wave emitted from various other home appliances, because the frequency of microwave is substantially apart from those of the electromagnetic waves. A microwave oscillating circuit mounted to a remote controller employs a strip-line stub of which tip is open. The strip-line stub is formed by a printed circuit board including a dielectric layer having a uniform dielectric constant and being subject to little loss in order to stabilize oscillating characteristics such as an oscillating frequency, oscillating output power and the like. A "kotatsu" is one of those home appliances adjustable with a microwave from a remote controller. A "kotatsu" is a Japanese traditional heating appliance used mostly in a living room. The constitution of "kotatsu" is explained in general in Prior Art of U.S. Pat. No. 4,449,034.

In the kotatsu, a remote controller is integrated into a top plate of the kotatsu and transmits a weak microwave signal modulated by a control signal to a receiver. The receiver integrated into a kotatsu body receives and demodulates the microwave signal, and the resultant signal controls a temperature of heating element of the kotatsu. Disperses of components characteristics transistors' characteristics among others making up the microwave oscillating circuit cause a disperse of an oscillating frequency. Since a control sensitivity of respective remote controllers is subject to the disperse, each product eventually has its own dispersion. In order to suppress this dispersion of the oscillating frequency, a bandwidth of a band-pass-filter in the receiver has been widened; however, the resultant receiver has been vulnerable to noises and unwanted electromagnetic waves. This method is, therefore, not appropriate to overcome the problem. Other methods described below have been employed to overcome the problem discussed above.

(1) Variable inductance 82A is added to an oscillating circuit as shown in FIG. 8A; however, this not only enlarges a size of a remote controller but also boosts the cost.

(2) Japanese Patent Application Non-examined Publication No. H05-335833 discloses that conductive small lands 85A–85E powered in advance are disposed in resonator 85, one of elements making up an oscillating circuit, as shown in FIG. 8B. The small lands are physically separated from resonator 85 by a laser cutter thereby varying an electrical length of resonator 85 so that an oscillating frequency can be adjusted. This method, however, requires an expensive precision apparatus such as a laser cutter.

(3) Japanese Patent Application Non-examined Publication No. H09-162642 discloses that tip-open type stubs 88A are provided in resonator 88 and conductive patterns 88B are disposed near resonator 88 in advance, where resonator 88 is coupled to strip-line stub 87 which connected to circuit 86 as shown in FIG. 8C. Those elements are electrically connected with solder or bonding wires thereby adjusting an oscillating frequency. This method, however, results in lowering reliability of the oscillating circuit because it requires solder bridges. Further, this method needs an expensive precision apparatus such as a wire-bonder.

SUMMARY OF THE INVENTION

The present invention addresses the problems discussed above and aims to provide a microwave oscillating circuit, which oscillates a frequency in a more stable manner than a conventional circuit, for a remote controller. This microwave oscillating circuit thus narrows the dispersion of control sensitivity of the remote controller.

The microwave oscillating circuit of the present invention adjusts the oscillating frequency by changing a length of a tip-open type strip-line-stub coupled to a base terminal of a transistor an element of the circuit mounted on a printed circuit board. For this purpose, small conductive lands are formed in an isolated manner near the open tip, and then these lands are coupled electrically with the stub tip. Chip resistors, in particular those having a small resisting value, are used for this coupling.

The construction discussed above allows the microwave oscillating circuit to adjust an oscillating frequency thereby compensating a dispersion of electrical characteristics of the transistors. This solves the problems previously discussed. The present invention thus can provide a quality, reliable and small size remote controller at a low cost.

DETAILED DESCRIPTION OF THE EXEMPLARY EMBODIMENTS

Prior to demonstrating the embodiments, a fundamental technical matter is described briefly hereinafter.

A transistor oscillating circuit, of which base terminal is used as an input terminal, is known for oscillating under the following condition:

(An oscillating circuit is a kind of feedback amplifying circuits, and thus the expression of "input" is relevant to this case.)

(1) Conductance viewed from the base terminal toward the transistor represents a negative polarity, and (2) Susceptance A viewed from the base terminal toward the transistor and susceptance B viewed from the base toward another side where an outer circuit is coupled to of the transistor have the same absolute value and the polarities opposite to each other.

When these two conditions are satisfied, the transistor oscillating circuit can oscillate. In this case, the oscillating frequency is determined by the condition (2). Therefore, when a length of strip-line-stub coupled to the transistor is changed, susceptance B changes and the transistor changes its own operating point so that the condition (2) can be satisfied. When the condition (1) is satisfied at the operating point, the oscillation is kept going. The susceptance discussed above is a function of a frequency, and thus the oscillating frequency changes correspondingly to a change of the susceptance. This is a mechanism for determining an oscillating frequency of a transistor oscillating circuit.

The exemplary embodiments of the present invention are demonstrated hereinafter with reference to the accompanying drawings.

(Exemplary Embodiment 1)

Figure 1:
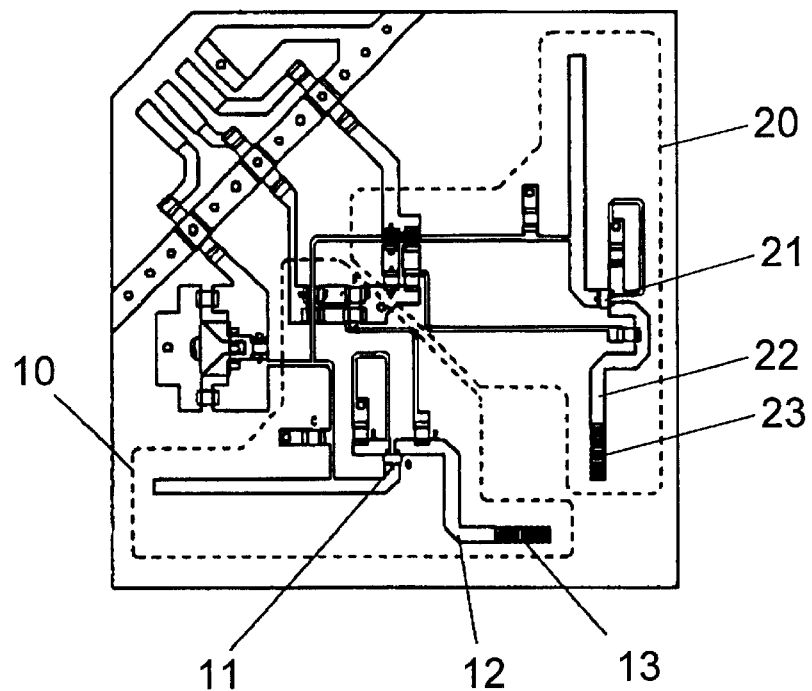
FIG. 1 is a plane view of a printed circuit board for an oscillating circuit of a remote controller in accordance with a first exemplary embodiment of the present invention.
Figure 2:
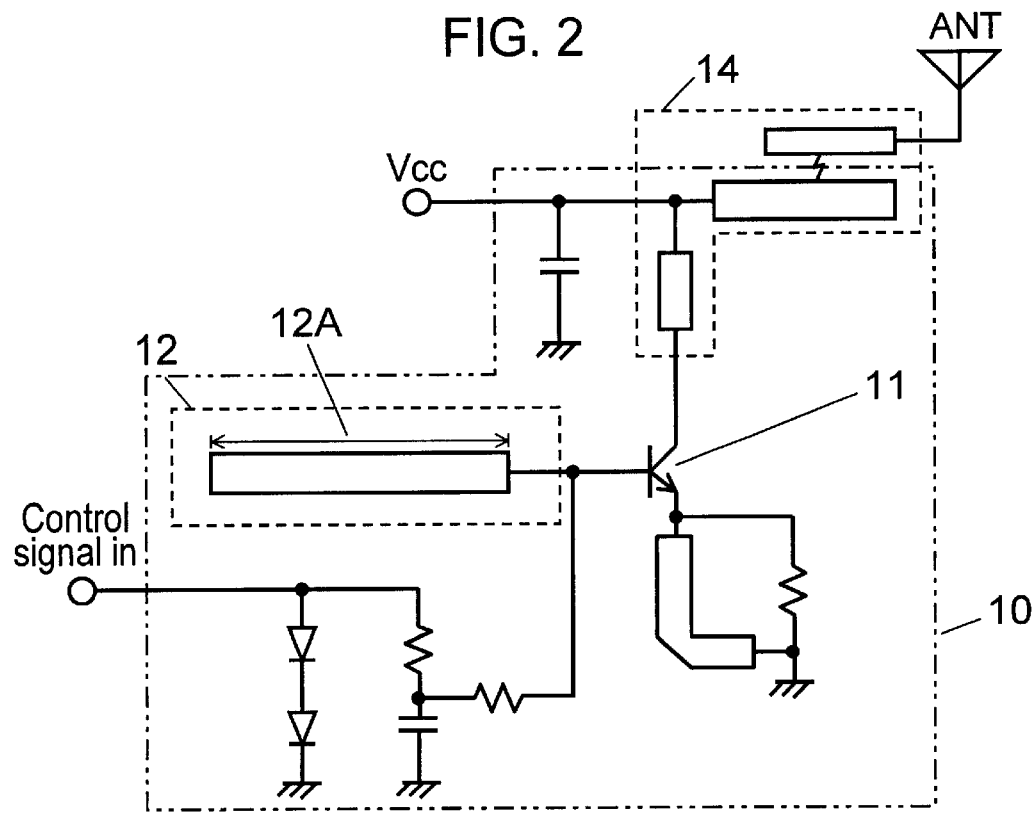
FIG. 2 is a circuit diagram equivalent to the oscillating circuit for the remote controller in accordance with the first exemplary embodiment of the present invention.
Figure 3:
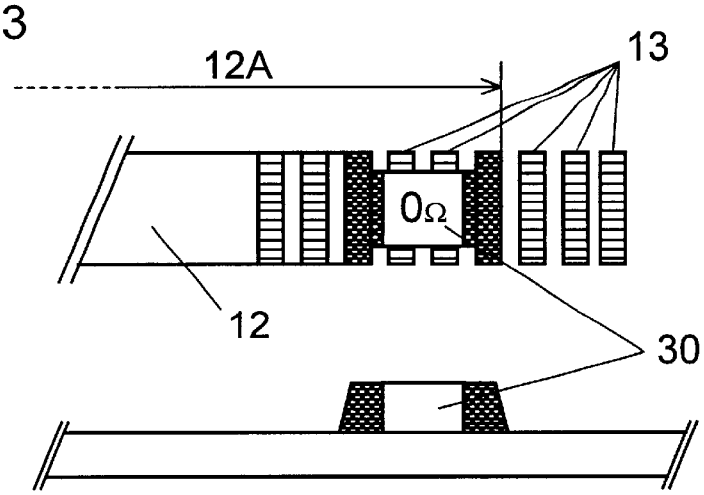
FIG. 3 is a view enlarging a stub tip coupled to a base terminal of the transistor in the oscillating circuit for the remote controller in accordance with the first exemplary embodiment of the present invention.
Figure 4A:
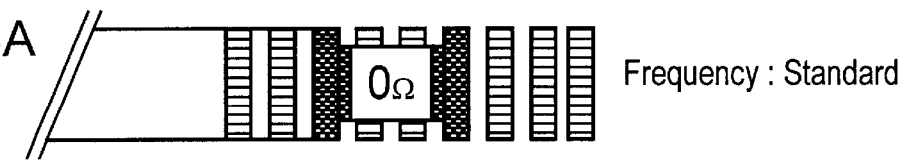
FIGS. 4A through 4E illustrate a method of adjusting a resonance frequency of the oscillating circuit for the remote controller in accordance with the first exemplary embodiment of the present invention.
Figure 4B:
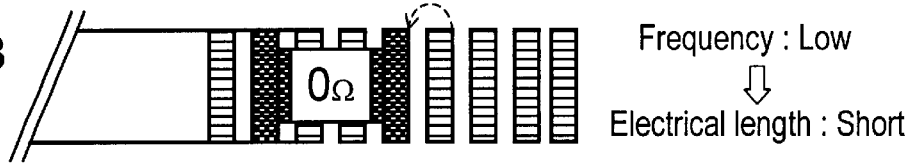
Figure 4C:
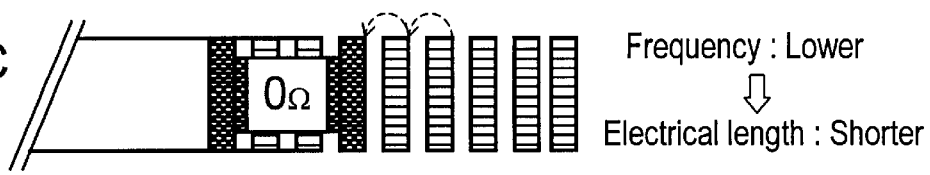
Figure 4D:
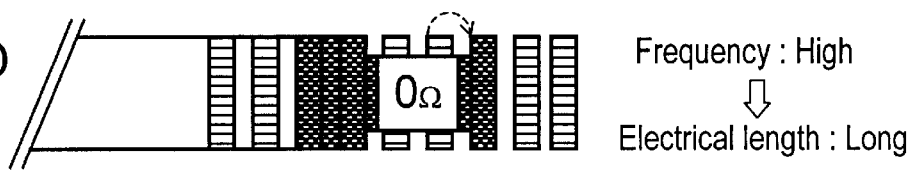
Figure 4E:
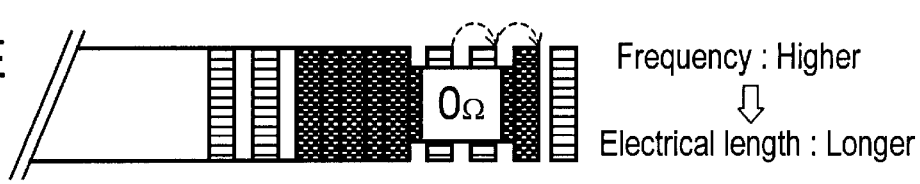

FIG. 1 illustrates a printed circuit board for an oscillating circuit of a remote controller in accordance with the first exemplary embodiment of the present invention. The electrical length of tip-open type strip-line-stub 12 is adjusted by using a plurality of conductive-small-lands 13 thereby adjusting an oscillating frequency, where stub 12 is coupled to the base of transistor 11. In FIG. 1, two oscillating circuits equivalent to each other are provided because if one of them fails to operate for some reason, the remote controller can function as far as another one keeps oscillating. FIG. 2 illustrates an equivalent circuit to this oscillating circuit. Like elements in both the circuits are denoted with the like reference numbers. An adjusting method of an electrical length of stub 12 is demonstrated with reference to FIG. 3 and FIG. 4. In FIG. 3, chip resistor 30 of zero ohm or substantially zero ohm is soldered to conductive small lands 13 provided closely with each other and near the tip of stub 12. The resultant stub 12 measures length 12A so that the oscillating frequency of the oscillating circuit shown in FIG. 1 is changed to a value responsive to length 12A.

FIG. 4 illustrates this adjusting method more specifically. FIG. 4A illustrates a case where the transistor characteristics are in a standard range, and this case is applicable to most of the cases. In this case, since the oscillating frequency falls within a target range, no adjustment is required. When transistor characteristics deviate from standard characteristics, an adjustment is required. It is the relation between a stub length and an oscillating frequency that the frequency rises at a shorter stub and the frequency lowers at a longer stub. Therefore, when the frequency is low, the stub length should be shortened as shown in FIG. 4B, and when the frequency is the lower, the stub length should be further shortened as shown in FIG. 4C. On the other hand, when the frequency is high, the stub should be extended as shown in FIG. 4D, and when the frequency is the higher, the stub should be further extended as shown in FIG. 4E.

This adjustment method requires simple works such as shifting a chip resistor in parallel with the land alignment and a little additional soldering. Employment of automatic-parts-mounting machines for general purpose application at a relatively low cost can contribute to further simple and precise adjustment as well as a lower manufacturing cost.

In this embodiment, a chip resistor of zero ohm or substantially zero ohm is employed; however, as far as the resistance value is small enough not to trouble the oscillating function, e.g. ca. one ohm, such a chip resistor can be used. If such a chip-less structure can trade off a lower reliability of the oscillating circuit, a chip resistor can be eliminated and solder bridges per se can function instead. This embodiment introduces the adjustment method which adjust an electrical length of the stub provided on the base side of the transistor; however, an electrical length of stub 14 provided on the collector side as shown in FIG. 2 can be adjusted for adjusting the oscillating frequency. This latter method is to change the susceptance A viewed from the base terminal toward the transistor thereby changing the oscillating frequency. This method has been described at the beginning of this section (Detailed Description of the Exemplary Embodiments). According to this method, the oscillating frequency can be also adjusted in the same manner as the case where the electrical length of the stub provided on the base side is adjusted.

(Exemplary Embodiment 2)

Figure 5:
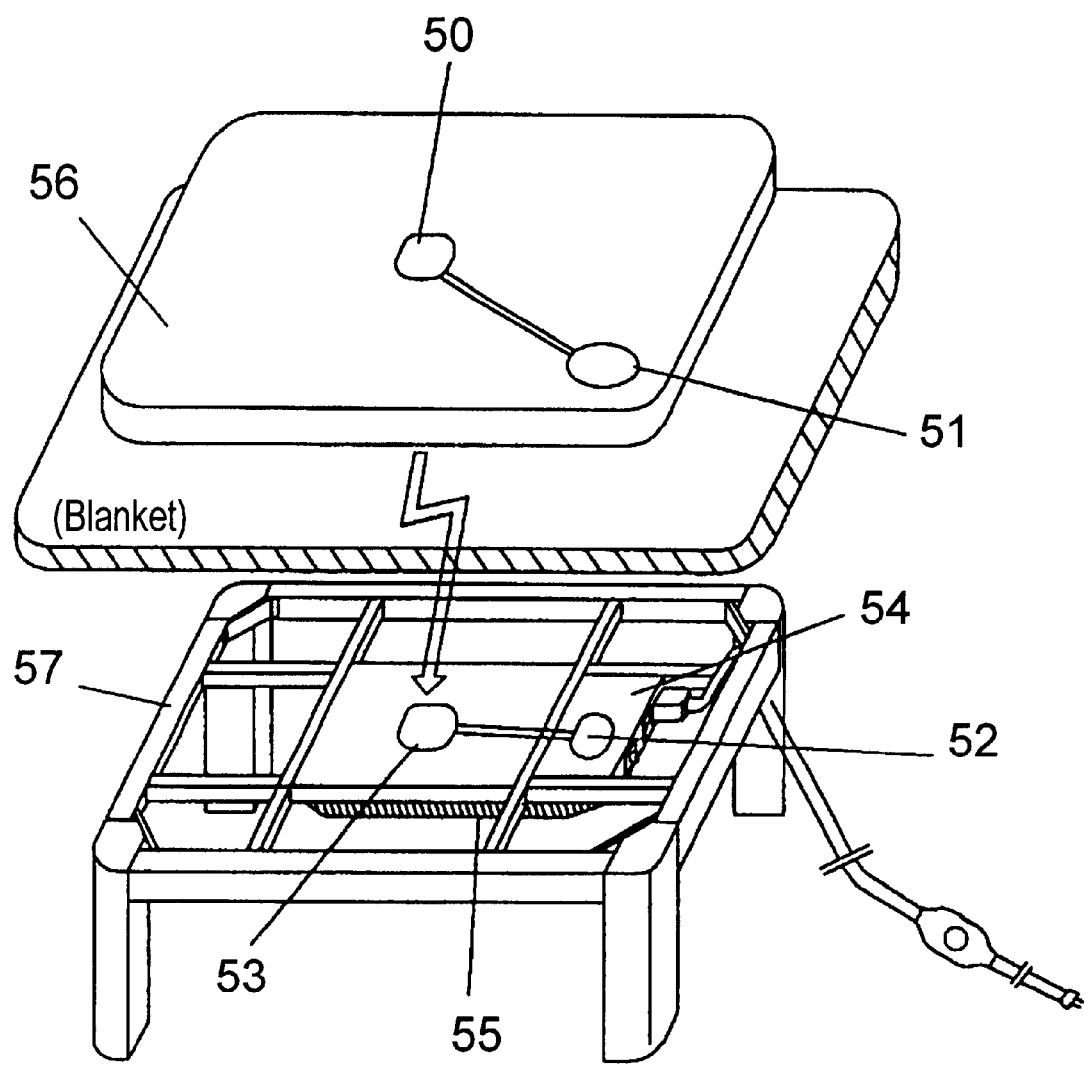
FIG. 5 is a perspective view of a "kotatsu" integrating an oscillating circuit for a remote controller in accordance with a second exemplary embodiment of the present invention.

FIG. 5 is a perspective view of a "kotatsu" employing an oscillating circuit for a remote controller in accordance with the second exemplary embodiment of the present invention. In FIG. 5, remote controller 50 modulates a microwave oscillating signal with a modulating signal supplied from operation panel 51 built in a corner of top plate 56. Controller 50 then irradiates the resultant signal from an receiving antenna 53 built therein to the receiver. The receiver comprises receiving antenna 53, signal processor 52 and controller 54. Receiving antenna 53 mounted at a center in a space above heating element 55 which is provided at the center of a wooden frame of "kotatsu" receives the modulated microwave signal and then signal processor 52 demodulates the signal into a control signal. This control signal is fed into controller 54 for controlling the heat volume of heating element 55.

Figure 6:
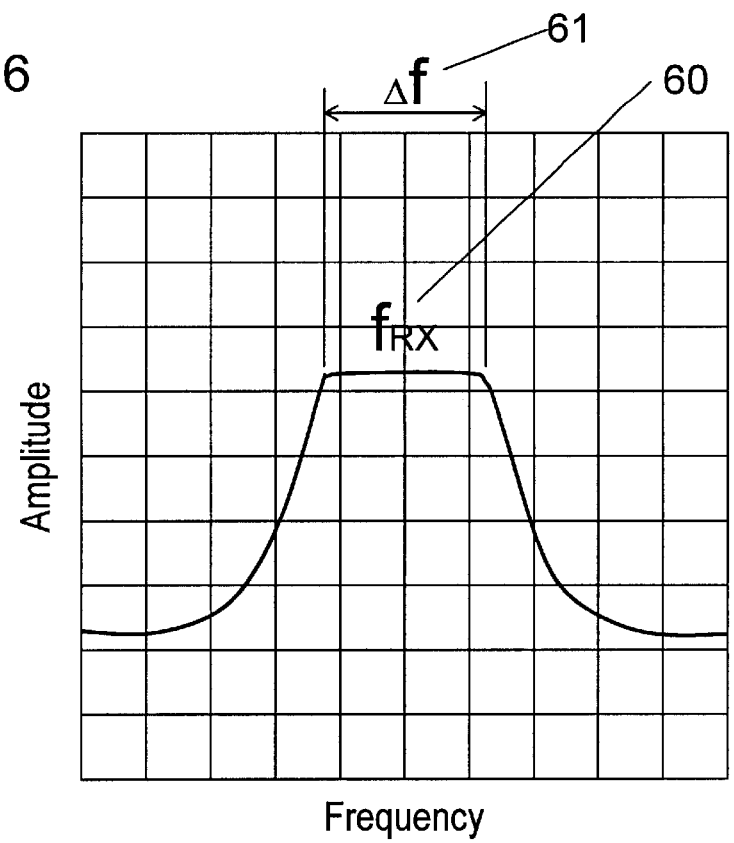
FIG. 6 shows frequency characteristics of a band-pass-filter in a receiver of a remote controller attached to the "kotatsu" in accordance with the second exemplary embodiment of the present invention.
Figure 7:
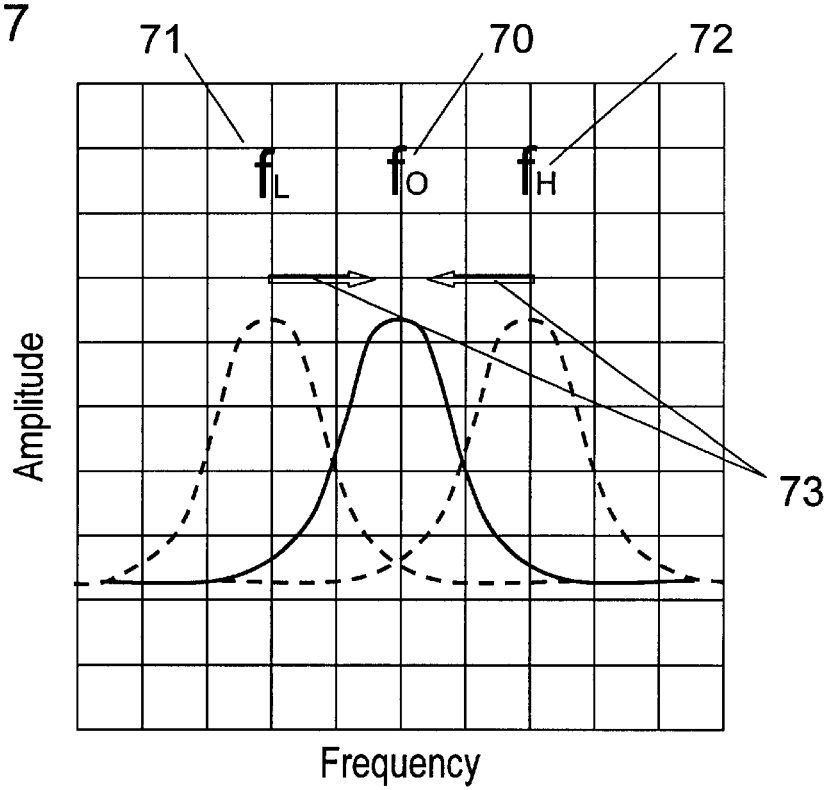
FIG. 7 shows oscillating frequency spectrums of a remote controller attached to the "kotatsu" in accordance with the second exemplary embodiment of the present invention.
Figure 8A:
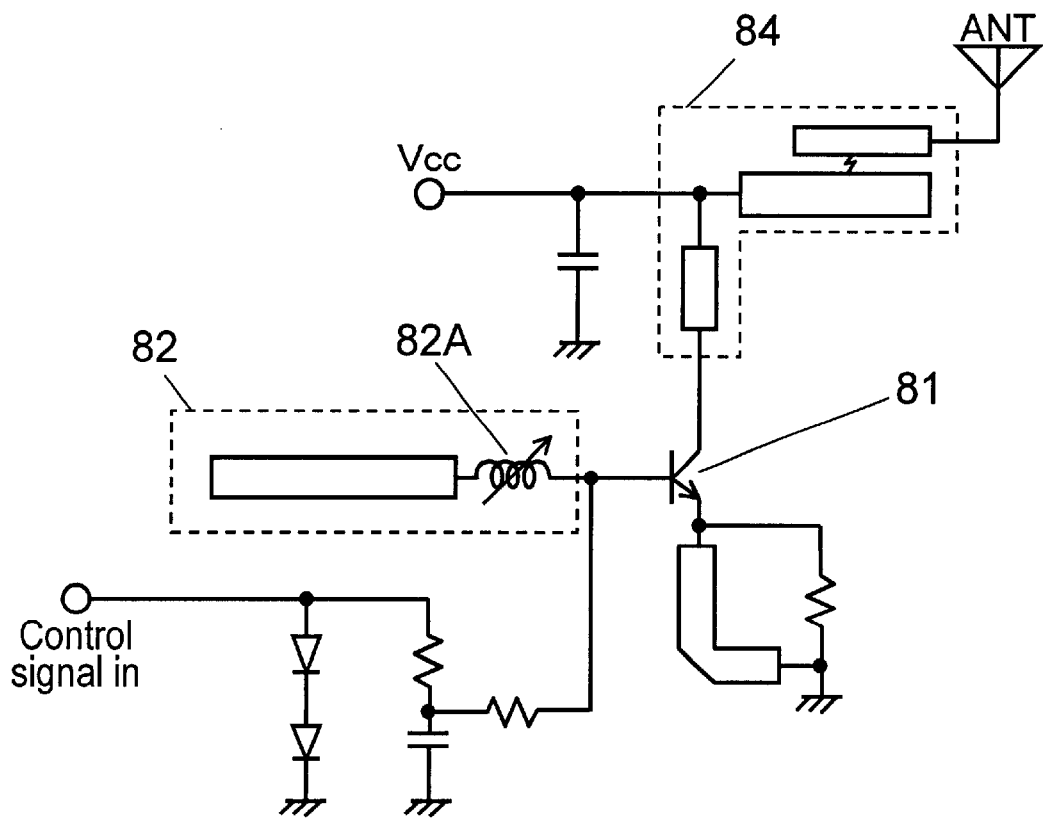
FIG. 8A is a circuit diagram equivalent to a conventional oscillating circuit of a remote controller.
Figure 8B:
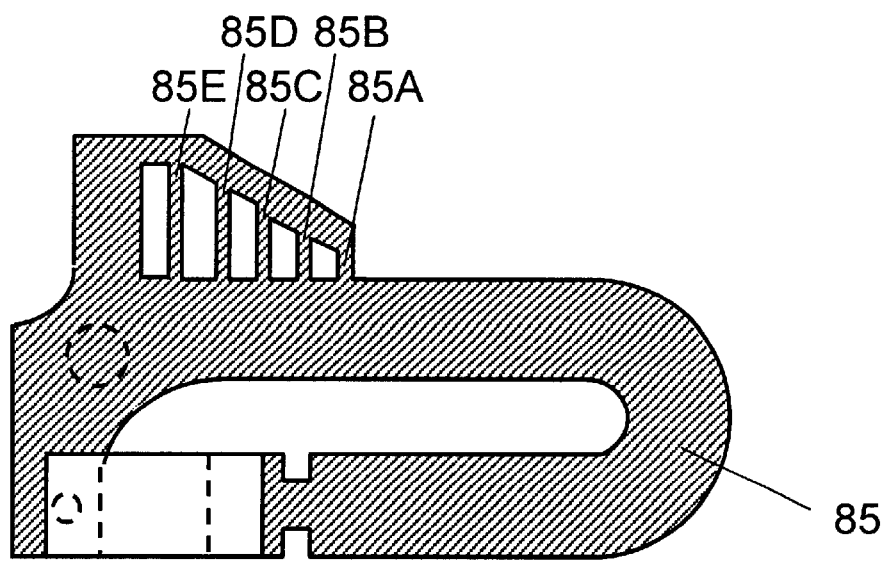
FIG. 8B illustrates a pattern of a printed circuit board for another conventional microwave oscillating circuit.
Figure 8C:
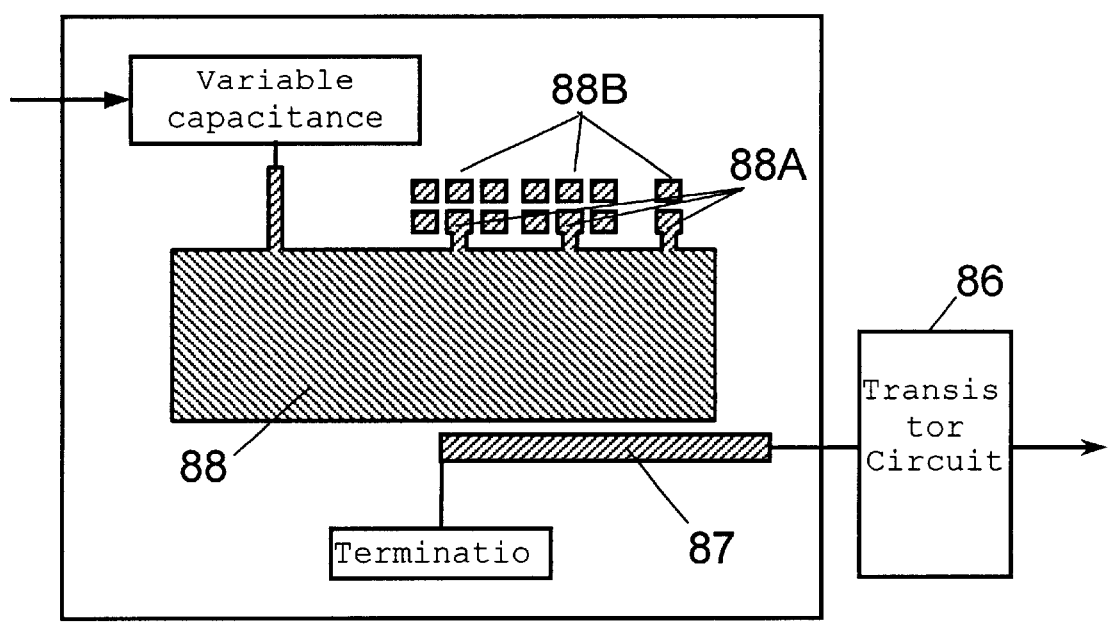
FIG. 8C illustrates a pattern of a printed circuit board for still another conventional microwave oscillating circuit.

FIG. 6 shows frequency characteristics of a band-pass-filter in an amplifier for a received signal, where the amplifier is incorporated into signal processor 52. FIG. 6 tells that this amplifier has a bandwidth, e.g. 200 MHz, marked with 61 of which center frequency, e.g. 3.0 GHz, is marked with 60 in FIG. 6. As shown in FIG. 7, a frequency spectrum of the microwave signal supplied from remote controller 50 shows standard oscillating frequency characteristic 70, characteristic 71 deviated to the lower side from the standard one, and characteristic 72 deviated to the higher side. These deviations are caused by dispersions of the components, in particular of the transistor. Those characteristics deviated from the standard can be adjusted in the direction of arrow mark 73 respectively shown in FIG. 7 so that they can be approximated substantially to the standard characteristic 70 by the adjusting method described in the first embodiment. The remote controller in accordance with the second embodiment can suppress the dispersion of a frequency transmitted. As a result, a quality "kotatsu" being attached with the remote controller and having a little dispersion of control sensitivity is realized.

The microwave oscillating circuit as discussed in the embodiments works in a frequency range of 2900 MHz to 3100 MHz of which center frequency is approximately 3000 MHz. The oscillating circuit is applicable to a frequency range of approximately 1 GHz to approximately 30 GHz.

The microwave oscillating circuit as discussed above changes the electrical length of the stub thereby adjusting an oscillating frequency, when the oscillating frequency deviates from a target frequency. This circuit includes conductive small lands disposed near the tip of tip-open type strip-line-stub coupled to the base terminal of the transistor in the circuit. These conductive small lands are coupled with the stub tip by either one of the following methods:

(1) providing a chip resistor of which resistance value ranges from zero ohm to substantially zero ohm;

(2) providing a chip resistor of which resistance value is small enough not to trouble the function of oscillating circuit; or (3) providing soldering.

Narrowing the dispersion of control sensitivity caused by the frequency dispersion improves the quality, employing a chip resistor also improves the reliability, eliminating a variable inductance downsizes the remote controller and reduces the cost thereof, and unemployment of an expensive and precision manufacturing apparatus lowers the manufacturing cost. These advantages realize a quality remote controller and an appliance attached with the remote controller at a low cost.

What is claimed is:

1. An oscillating circuit including a microwave transistor, a printed circuit board, and said oscillating circuit comprising:

a strip-line-stub provided on the printed circuit board, and of which a first end is coupled with a base terminal of the transistor and a second end is open;

a plurality of conductive lands disposed in a close proximity to the second end of said stub, said plurality of conductive lands disposed in a close proximity to each other; and a chip resistor which couples the second end of said stub with a conductive land selected from said plurality of conductive lands in order to change an oscillating frequency of said oscillating circuit.

2. The oscillating circuit as defined in claim 1 wherein said chip resistor has a resistance ranging from zero ohms to substantially zero ohms.

3. The oscillating circuit as recited in claim 1 wherein said chip resistor has a low enough resistance value to allow said oscillating circuit to oscillate in a desired frequency range.

4. The oscillating circuit including a microwave transistor, a printed circuit board, and said oscillating circuit comprising:

a strip-line-stub provided on the printed circuit board, and of which a first end is coupled with a base terminal of the transistor and a second end is open;

a plurality of conductive lands disposed in a close proximity to the second end of said stub, said plurality of conductive lands disposed in a close proximity to each other; and a chip resistor and a solder bridge connected in series, said resistor and said solder bridge coupling the second end of said stub with a conductive land selected from said plurality of conductive lands in order to change an oscillating frequency of said oscillating circuit.

5. The oscillating circuit as defined in claim 4 wherein said chip resistor has a low enough resistance value to allow said oscillating circuit to oscillate in a desired frequency range.

6. The oscillating circuit as recited in claim 4, wherein said chip resistor has a resistance ranging from zero ohms to a substantially zero ohms.

7. A remotely controllable "kotatsu" integrated with an oscillating circuit including a microwave transistor and a printed circuit board for a remote controller, said oscillating circuit comprising:

a strip-line-stub provided on said printed circuit board, and of which a first end is coupled to a base terminal of said transistor and a second end is open;

a plurality of conductive lands disposed in a close proximity to the second end of said stub, said plurality of conductive lands disposed in a close proximity to each other; and a chip resistor which couples the second end of said stub with a conductive land selected from said plurality of conductive lands in order to change an oscillating frequency of said oscillating circuit.

8. The remotely controllable "kotatsu" as defined in claim 7 wherein said chip resistor has a resistance ranging from zero ohms to substantially zero ohms.

9. The remotely controllable "kotatsu" as recited in claim 7 wherein said chip resistor has a low enough resistance value to allow said oscillating circuit to oscillate in a desired frequency range.

10. A remotely controllable "kotatsu" integrated with an oscillating circuit including a microwave transistor and a printed circuit board for a remote controller, said oscillating circuit comprising:

a strip-line-stub provided on the printed circuit board, and of which a first end is coupled with a base terminal of the transistor and a second end is open;

a plurality of conductive lands disposed in a close proximity to the second end of said stub, said plurality of conductive lands disposed in a close proximity to each other; and a chip resistor and solder bridge which are connected in series, said resistor and said solder bridge coupling the second end of said stub with a conductive land selected from said conductive lands in order to change an oscillating frequency of said oscillating circuit.

11. The remotely controllable "kotatsu" as recited in claim 10, wherein said chip resistor has a low enough resistance value to allow said oscillating circuit to oscillate in a desired frequency range.

12. The remotely controllable "kotatsu" as recited in claim 10, wherein said chip resistor has a resistance ranging from zero ohms to substantially zero ohms.

* * * * *